US012590000B2

(12) United States Patent
Perng et al.

(10) Patent No.: US 12,590,000 B2
(45) Date of Patent: Mar. 31, 2026

(54) POROUS CARBON COMPOSITE MATERIAL AND MANUFACTURING METHOD THEREOF

(71) Applicant: National Tsing Hua University, Hsinchu (TW)

(72) Inventors: Tsong-Pyng Perng, Hsinchu (TW); Tzu-Kang Chin, Hsinchu (TW); Ming-Wei Liao, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 718 days.

(21) Appl. No.: 17/872,502

(22) Filed: Jul. 25, 2022

(65) Prior Publication Data

US 2023/0264958 A1      Aug. 24, 2023

(30) Foreign Application Priority Data

Feb. 22, 2022    (TW) ................................. 111106277

(51) Int. Cl.
  *C01B 32/05*        (2017.01)
  *C01B 32/205*       (2017.01)
    (Continued)
(52) U.S. Cl.
  CPC ............ *C01B 32/05* (2017.08); *C01B 32/205* (2017.08); *C01B 32/21* (2017.08); *C23C 16/40* (2013.01);
    (Continued)
(58) Field of Classification Search
  CPC ....... C01B 32/05; C01B 32/205; C01B 32/21;
    C23C 16/40; C23C 16/45527; C23C 16/403; C23C 16/405; C23C 16/45555; C23C 18/1208; C23C 18/1254; C23C 16/045; D01F 9/22; D06M 11/36;
    (Continued)

(56) References Cited

U.S. PATENT DOCUMENTS 10,450,652 B2    10/2019  Liu

FOREIGN PATENT DOCUMENTS

CN        1809516 A      7/2006
CN      103706407 A      4/2014
    (Continued)

OTHER PUBLICATIONS

Mao, et al., Al2O3-Assisted Confinement Synthesis of Oxide/ Carbon Hollow Composoite Nanofiers and Application in Metal-Ion Capacitors, Small 2020; 16: 2001950, pp. 1-9 with Supporting Information (Year: 2020).*
    (Continued)

*Primary Examiner* — Daniel C. McCracken
(74) *Attorney, Agent, or Firm* — Lippes Mathias LLP

(57) ABSTRACT
A manufacturing method of a porous carbon composite material includes the following steps. A polymer template is provided, the polymer template includes a polymer compound, and the polymer template has a plurality of pores. A coating step is performed, wherein a metal compound is coated on the polymer template to form a transition intermediate. A heating step is performed, wherein the transition intermediate is heated to transform the polymer template to a carbon template and transform the metal compound to a coating layer, and a porous carbon composite material is obtained.

11 Claims, 7 Drawing Sheets

(51) Int. Cl.

| | | |
|---|---|---|
| *C01B 32/21* | (2017.01) | |
| *C23C 16/40* | (2006.01) | |
| *C23C 16/455* | (2006.01) | |
| *D01F 9/22* | (2006.01) | |
| *D06M 11/36* | (2006.01) | |
| *D06M 11/64* | (2006.01) | |
| *D06M 101/40* | (2006.01) | |

(52) U.S. Cl.
CPC .......... *C23C 16/45527* (2013.01); *D01F 9/22* (2013.01); *D06M 11/36* (2013.01); *D06M 11/64* (2013.01); *C01P 2006/16* (2013.01); *D06M 2101/40* (2013.01); *D10B 2101/12* (2013.01)

(58) Field of Classification Search
CPC .. D06M 11/64; D06M 2101/40; D06M 11/58; D06M 2101/28; D06M 2101/30; D06M 2101/34; D06M 2400/02; D06M 11/45; D06M 11/46; C01P 2006/16; D10B 2101/12; C08J 2301/00; C08J 2333/20; C08J 2379/08; C08J 2381/06; C08J 7/06
See application file for complete search history.

(56) References Cited

FOREIGN PATENT DOCUMENTS

| | | |
|---|---|---|
| CN | 104372525 A | 2/2015 |
| CN | 111088562 A | 5/2020 |
| CN | 113023726 A | 6/2021 |
| CN | 113680341 A | 11/2021 |
| KR | 100717575 B1 | 5/2007 |
| TW | I518718 B | 1/2016 |
| TW | 202200691 A | 1/2022 |

OTHER PUBLICATIONS

George, et al., Understanding the Pore Formation in ALD Alumina Overcoats, ACS Appl. Mater. Interfaces 2020; 12: 20331-20343 (Year: 2020).*

Szilagyi, et al., Review on one-dimensional nanostructures prepared by electrospinning and atomic layer deposition, Journal of Physics: Conference Series 2014; 559: 012010, pp. 1-13 (Year: 2014).*

Tsong-Pyng Perng et al., "Development of Second Generation Forced Flow Atomic Layer Deposition System and Its Application in Fabricating 3d Nanostructured Solar Energy Devices (3/3)", Final report of MOST(Ministry of Science and Technology)—Granted Research Project, dated on Sep. 15, 2018, implemented by Department of Materials Science and Engineering, National Tsing Hua University, Taiwan, R.O.C. with its English abstract.

Yue, Ying, et al. "A mesoporous carbon nanofiber-modified pyrolytic graphite electrode used for the simultaneous determination of dopamine, uric acid, and ascorbic acid." Carbon 50.1 (2012): 107-114.

Zhou, Yongsheng, et al. "A nitrogen-doped 3D open-structured graphite nanofiber matrix for high-performance supercapacitors." Journal of Materials Chemistry A 6.29 (2018): 14065-14068.

Chen, Juan. Manufacturing polyacrylonitrile nanowires and nanofibers for sensing and energy storage applications. Diss. Louisiana Tech University, 2016.

Meng, Yan, et al. "A family of highly ordered mesoporous polymer resin and carbon structures from organic-organic self-assembly." Chemistry of materials 18.18 (2006): 4447-4464.

Ramos, Alberto, Ignacio Camean. and Ana B. Garcfa. "Graphitization thermal treatment of carbon nanofibers." Carbon 59 (2013}: 2-32.

Jiang, Zhao, et al. "3D self-bonded porous graphite fiber monolith for phase change material composite with high thermal conductivity." Chemical Engineering Journal 438 (2022): 135496.

Yang Huang, et al. "Flexible cathodes of multifunctional interlayers based on carbonized bacterial cellulose for high-performance lithium-sulfur batteries" Journal of Materials Chemistry A, published Apr. 15, 2015, vol. 3, issue 20.

Zhifei Mao et al., "Al2O3-Assisted Confinement Synthesis of Oxide/Carbon Hollow Composite Nanofibers and Application in Metal-Ion Capacitors" -dated Jul. 9, 2020 (9pgs).

Luis Zuniga et al., "Multichannel hollow structure for improved electrochemical performance of TiO2/Carbon composite nanofibers as anodes for lithium ion batteries"-dated Jun. 11, 2016 (11pgs).

Lijun Ji et al., "Synthesis of carbon- and nitrogen-doped TiO2/carbon composite fibers by a surface-hydrolyzed PAN fiber and their photocatalytic property"-dated Oct. 16, 2019 (11pgs).

* cited by examiner

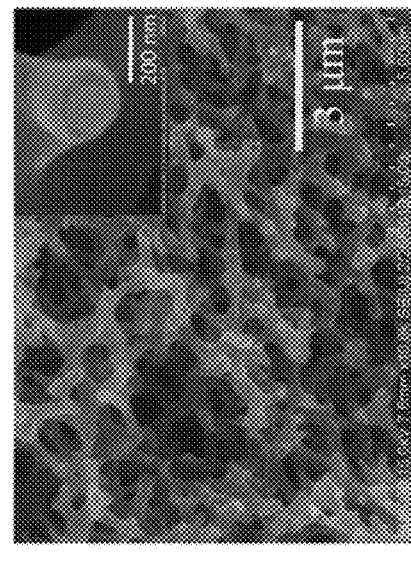
Fig. 2A
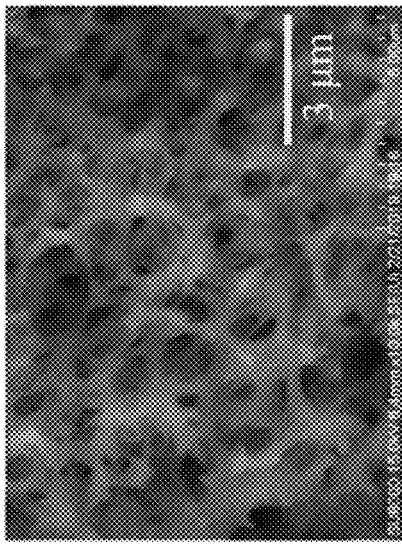
Fig. 2B
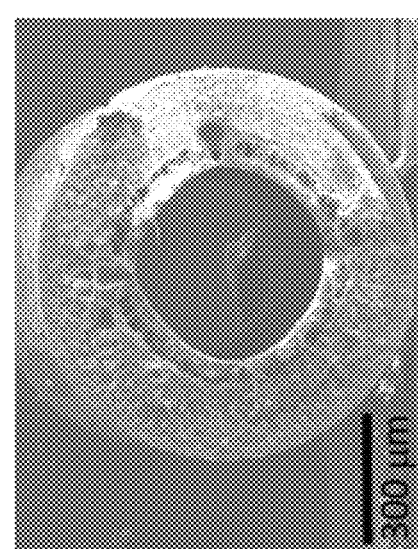
Fig. 2C
Fig. 2D

1

POROUS CARBON COMPOSITE MATERIAL AND MANUFACTURING METHOD THEREOF

RELATED APPLICATIONS

This application claims priority to Taiwan Application Serial Number 111106277, filed Feb. 22, 2022, which is herein incorporated by reference.

BACKGROUND

Technical Field

The present disclosure relates to a porous carbon composite material and a manufacturing method thereof. More particularly, the present disclosure relates to a porous carbon composite material that can maintain its original structure of the polymer template and a manufacturing method thereof.

Description of Related Art

The commercial porous polymer materials have high separation performance for gas and liquid and are widely used in gas separation and hemodialysis, and can be made into a hollow fiber. However, the application of polymer materials is limited due to their inability to withstand high temperatures and harsh operating environments. In general, for the carbon material made from polymer material, the electrospinning or phase change wet spinning technology is currently used. The polymer precursor is made into hollow fiber which is then sintered and made into carbon hollow fiber. However, during the sintering process, the heating conditions must be precisely controlled, and the selection of polymer precursors is also limited. Further, the microstructure of the final product of carbon hollow fiber is very different from that of the original polymer material, so that the final product of carbon hollow fiber cannot be used for more precise applications.

Therefore, to improve the manufacturing method of porous carbon composite material so that the original structure of the polymer material can be maintained at macroscopic and microscopic scales after sintering and carbonization has become the goal of related academia and industry.

SUMMARY

According to one aspect of the present disclosure, a manufacturing method of a porous carbon composite material includes the following steps. A polymer template is provided, wherein the polymer template includes a polymer compound, and the polymer template has a plurality of pores. A coating step is performed, wherein a metal compound is coated on the polymer template to form a transition intermediate. A heating step is performed, wherein the transition intermediate is heated to transform the polymer template to a carbon template and transform the metal compound to a coating layer, and a porous carbon composite material is obtained.

According to another aspect of the present disclosure, a porous carbon composite material manufactured by the abovementioned manufacturing method of the porous carbon composite material includes the carbon template and the coating layer. The carbon template has a plurality of mesopores, and a diameter of each of the mesopores is 2 nm to 50 nm. The coating layer is coated on the carbon template.

BRIEF DESCRIPTION OF THE DRAWINGS

The present disclosure can be more fully understood by reading the following detailed description of the embodiment, with reference made to the accompanied drawings as follows:

FIG. 2A is an SEM image of a polymer template of the present disclosure.

FIG. 2B is an SEM image of a transition intermediate of the present disclosure.

FIG. 2C is another SEM image of the transition intermediate of the present disclosure.

FIG. 2D is an EDX elemental mapping image of titanium element of the present disclosure.

DETAILED DESCRIPTION

Figure 1:
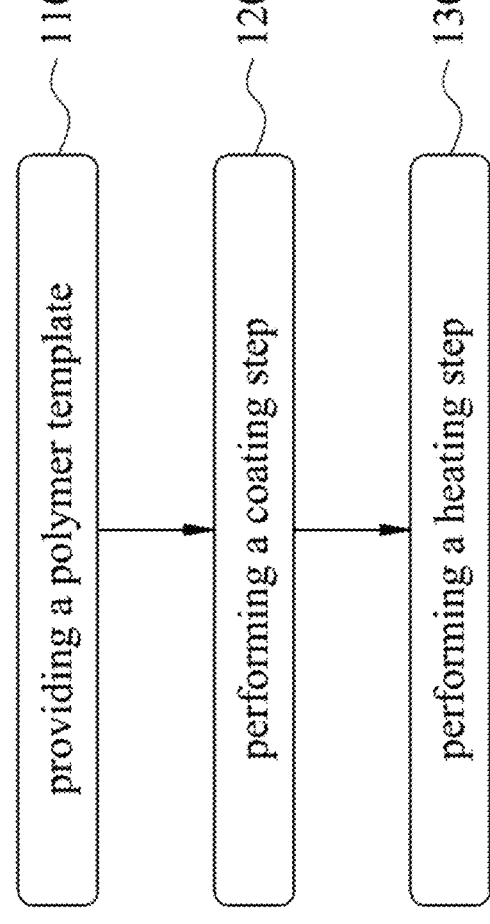
FIG. 1 is a flow chart of a manufacturing method of a porous carbon composite material according to one embodiment of the present disclosure.

Please refer to FIG. 1. FIG. 1 is a flow chart of a manufacturing method of a porous carbon composite material 100 according to one embodiment of the present disclosure. The manufacturing method of the porous carbon composite material 100 includes steps 110, 120 and 130. Each step is further described as follows.

In the step 110, a polymer template is provided. The polymer template includes a polymer compound, and the polymer template has a plurality of pores. In detail, the polymer template has an interconnected nanostructure (shown in FIG. 2A). The interconnected nanostructure forms a plurality of pores, and the polymer template has mesoporous property. Specifically, the polymer compound can be polyacrylonitrile (PAN), polyimide (PI), cellulose, polysulfone (PSF) or other organic material that can be carbonized, and the present disclosure will not be limited thereto.

In the step 120, a coating step is performed. A metal compound is coated on the polymer template to form a transition intermediate. In the coating step, an atomic layer deposition (ALD) method or a sol-gel method can be used to coat the metal compound on the polymer template. Therefore, the metal compound can be more uniformly and completely coated on the polymer template and its interconnected nanostructure.

Specifically, the metal compound can be a metal oxide. For example, the metal oxide can be $MnO_2$, $ZrO_2$, $WO_3$, $HfO_2$, $Ta_2O_5$, $VO_2$, $NbO_2$, $Cr_2O_3$, $MoO_3$, $CeO_2$, $ZnO$, $TiO_2$, $Al_2O_3$, $SiO_2$, $CuO$, $NiO$, $Fe_2O_3$, $CoO$, $SnO_2$, $Ga_2O_3$, $GeO_2$ or a combination of the above, and the present disclosure will not be limited thereto.

If the step 120 is performed as the atomic layer deposition method, the precursor of metal is utilized to attach to the polymer template at first. An inert gas is utilized to remove the unreacted precursor. A second precursor of oxygen is then introduced to react with the metal precursor on the polymer surface to form a monolayer of metal oxide. A second purge with an inert gas is then made to remove the unreacted precursor and byproducts. The above process is called as a cycle, and each cycle only forms a thin film having a thickness of an atomic layer. Accordingly, the thickness of the metal compound coated on the polymer template can be controlled by the cycle number of the atomic layer deposition of the coating step. Specifically, in the manufacturing method of the porous carbon composite material 100 of the present disclosure, the coating step can be repeated 1 to 2000 times. Preferably, the coating step can be repeated 50 to 2000 times so as to obtain a sufficient thickness. The thickness of the metal compound coated on the polymer template can be 1 Å to 2000 Å, preferably, the thickness of the metal compound coated on the polymer template can be 50 Å to 2000 Å.

In the step 130, a heating step is performed. The transition intermediate is heated to carbonize the polymer compound therein and transform the polymer template to a carbon template, and transforms the metal compound to a coating layer, and a porous carbon composite material is obtained. The porous carbon composite material can be a hierarchical structure. In detail, the heating step can be performed under an ammonia atmosphere or an inert gas atmosphere. In the heating step, the transition intermediate is heated at a heating temperature, and the heating temperature is 500° C. to 1000° C. The transition intermediate can be heated at a heating rate which can be 1° C./min to 50° C./min, and the heating step can be performed for 0.5 hours to 72 hours.

Specifically, the operating conditions of the heating step can be determined depending on the properties of the metal compound and the polymer template, and the degree of carbonization of the polymer template. According to different operating conditions, the coating layer transformed from the metal compound can be a metal oxide, a metal oxynitride or a metal nitride. In detail, the manufacturing method of the porous carbon composite material 100 of the present disclosure can manufacture a porous carbon composite material containing metal oxide (metal oxide@C), a porous carbon composite material containing metal oxynitride (metal oxynitride@C) and a porous carbon composite material containing metal nitride (metal nitride@C), but the present disclosure will not be limited thereto.

Figure 3B:
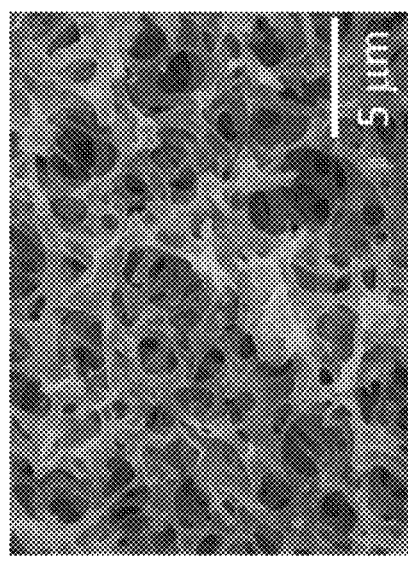
FIG. 3B is another SEM image of Example 1 of the present disclosure.

By the operation of the manufacturing method of the porous carbon composite material 100 described above, a porous carbon composite material can be finally obtained. The porous carbon composite material includes the carbon template and the coating layer. The coating layer is coated on the carbon template. The carbon template has a plurality of mesopores, and the diameter of each of the mesopores is 2 nm to 50 nm. In detail, the carbon template has an interconnected nanostructure (as shown in FIG. 3B), and the interconnected nanostructure forms the plurality of mesopores.

The porous carbon composite material of the present disclosure can be a hollow fiber structure or an aerographite structure. Specifically, the hollow fiber has high separation performance for gas and liquid and is widely used in gas separation and hemodialysis. The aerographite has multiple applications, such as energy storage, catalysis, gas storage, wastewater treatment, heat resistance, and other functions and applications. By applying the manufacturing method of the porous carbon composite material 100 of the present disclosure, the performance of the abovementioned application can be improved, and the application thereof can be wider.

In the manufacturing method of the porous carbon composite material 100, the metal compound is uniformly coated on the polymer template and its interconnected nanostructure, so that the deformation of the polymer compound of the polymer template turning into the carbon can be limited, and it is beneficial to maintain the structural integrity of the carbon template and interconnected nanostructure of the porous carbon composite material. In detail, the coating of the metal compound prevents the structure of the polymer template from being damaged during the carbonization process of the heating step, and the structural geometry of the carbon template and the interconnected nanostructure of the porous carbon composite material can be consistent with the structural geometry of the polymer template and its interconnected nanostructure. In this way, the macroscopic and microscopic structures of the porous carbon composite material can be controlled by the original structure of the polymer template, and the geometry and the structure of the porous carbon composite material can be controlled more accurately and precisely. Further, the carbonization of the polymer compound into carbon can make the porous carbon composite material conductive, the chemical stability thereof can be improved, and the application thereof can be also increased.

In the conventional manufacturing method of the porous carbon composite material, the electrospinning or phase change wet spinning technology is used. The polymer precursor is mixed with other substances, then process into a predetermined structure, such as hollow fibers, and then sintered it into the porous carbon material. However, during the sintering process, in order to maintain the structural integrity of the pores, the heating conditions must be precisely controlled, and the selection of polymer precursors is also limited. The microstructure of the formed product of carbon composites and porous carbon materials is very different from that of the original polymer materials, which cannot meet the more precise needs, and their application will be limited. Compared with the conventional manufacturing method of porous carbon composite material, in the manufacturing method of the porous carbon composite material 100 of the present disclosure, it can heat up and carbonize faster, and the process time can be reduced. Further, the structure of the porous carbon composite material can still maintain the same as the original structure of the polymer template. Therefore, the macroscopic and microscopic structures of the porous carbon composite material of the present disclosure can be controlled more precisely, and the requirements of more precise application can be achieved.

Reference will now be made in detail to the present embodiments of the present disclosure, examples of which are illustrated in the accompanied drawings.

Examples/Comparative Example

In order to more carefully illustrate the advantages of the manufacturing method of the porous carbon composite material 100 of the present disclosure, Example 1, Example 2, Example 3, Example 4 and Comparative Example 1 are presented in the following. Examples 1-4 are porous carbon composite materials manufactured by the manufacturing method of the porous carbon composite material 100. Comparative Example 1 is a porous carbon material directly heated without coating the metal compound. The polymer compound of the polymer template used in Examples 1-4 is polysulfone.

In detail, Example 1 is a porous carbon composite hollow fiber containing titanium oxynitride ($TiO_xN_{1-x}$@carbon hollow fiber). Example 2 is a porous carbon composite hollow fiber containing titanium nitride (TiN@carbon hollow fiber). Example 3 is a porous carbon composite hollow fiber containing aluminum oxide ($Al_2O_3$@carbon hollow fiber). Example 4 is a porous carbon composite hollow fiber containing titanium oxynitride prepared by a sol-gel method ($TiO_xN_{1-x}$@carbon hollow fiber). The manufacturing method of each embodiment will be described below.

In the preparation of Example 1 and Example 2, the atomic layer deposition method is used to coat the titanium dioxide on the polysulfone and is repeated for 400 times. The heating step is performed under an ammonia atmosphere, the heating temperature is set at 800° C. to carbonize the polysulfone, and the titanium dioxide is transformed into titanium oxynitride, then Example 1 is obtained. Further, Example 2 can be obtained if the heating temperature is set at 1000° C. to make the titanium dioxide completely nitridized to titanium nitride.

In the preparation of Example 3, the atomic layer deposition method is used to coat the aluminum oxide on the polysulfone and is repeated for 200 times. The heating step is performed in an argon atmosphere, and the heating temperature is set at 800° C. to carbonize the polysulfone. The aluminum oxide is transformed into γ-crystalline phase, and Example 3 is obtained.

In the preparation of Example 4, the polysulfone is immersed in the titanium tetraisopropoxide solution (TTIP, 1 wt %) diluted with isopropyl alcohol (IPA). The bubbles inside the polysulfone are removed by ultrasonic vibration, and the titanium tetraisopropoxide solution is filled in the polysulfone and its interconnected nanostructure. The polysulfone coated with titanium tetraisopropoxide is removed from the titanium tetraisopropoxide solution, wherein the titanium tetraisopropoxide reacts with the moisture in air to form titanium dioxide. Next, the heating step is performed to nitridize the titanium dioxide to titanium oxynitride, and Example 4 is obtained.

Please refer to FIGS. 2A to 2D. FIG. 2A is an SEM (scanning electron microscopic) image of a polymer template of the present disclosure. FIG. 2B is an SEM image of a transition intermediate of the present disclosure. FIG. 2C is another SEM image of the transition intermediate of the present disclosure. FIG. 2D is an EDX elemental mapping image of titanium element of the present disclosure.

In detail, FIGS. 2A to 2D show images of the transition intermediate of the manufacturing method of the porous carbon composite material 100 of the present disclosure. Further, FIGS. 2A to 2C are SEM images under various magnifications. As shown in FIGS. 2A to 2D, the titanium element is uniformly coated on the surface of the polymer template and the interconnected nanostructure, which shows that the titanium dioxide can be completely and uniformly coated on the polymer template by the atomic layer deposition method and can further ensure the structural integrity after the heating step.

Figure 3D:
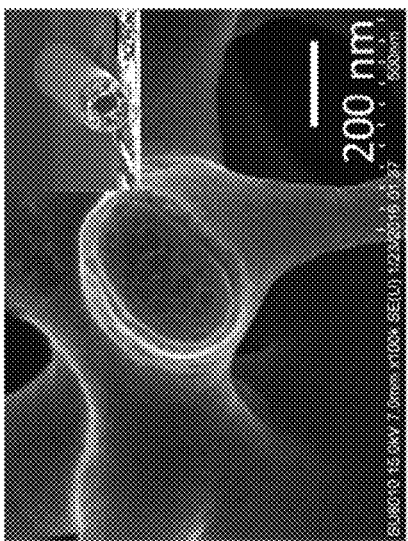
FIG. 3D is the other SEM image of Example 1 of the present disclosure.
Figure 3A:
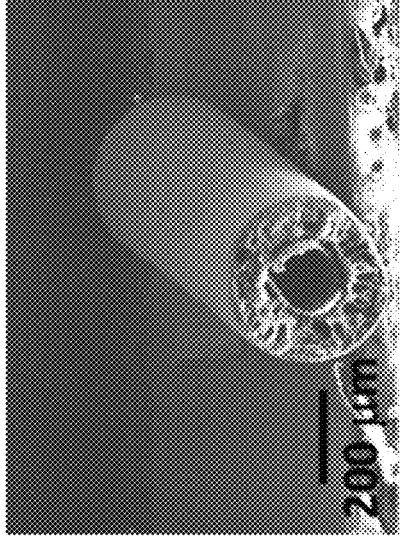
FIG. 3A is an SEM image of Example 1 of the present disclosure.
Figure 3C:
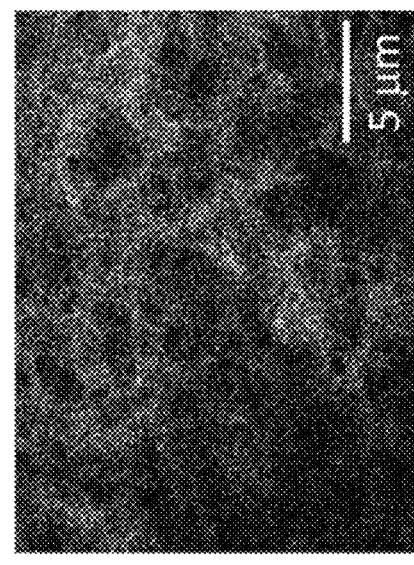
FIG. 3C is an EDX elemental mapping image of carbon element of Example 1 of the present disclosure.

Please refer to FIGS. 3A to 3D. FIG. 3A is an SEM image of Example 1 of the present disclosure. FIG. 3B is another SEM image of Example 1 of the present disclosure. FIG. 3C is an EDX elemental mapping image of carbon element of Example 1 of the present disclosure. FIG. 3D is the other SEM image of Example 1 of the present disclosure.

In detail, FIGS. 3A, 3B and 3D are SEM images under various magnifications. As shown in FIG. 3A, the macroscopic structure of Example 1 remains intact after the heating step. As shown in FIGS. 3B and 3D, the coating on the interconnected nanostructure of Example 1 is also quite uniform. Further, as shown in FIG. 3C, the carbon element is distributed evenly, indicating that the polymer template has been completely carbonized into the carbon template.

Figures 4A, 4B, 4C:
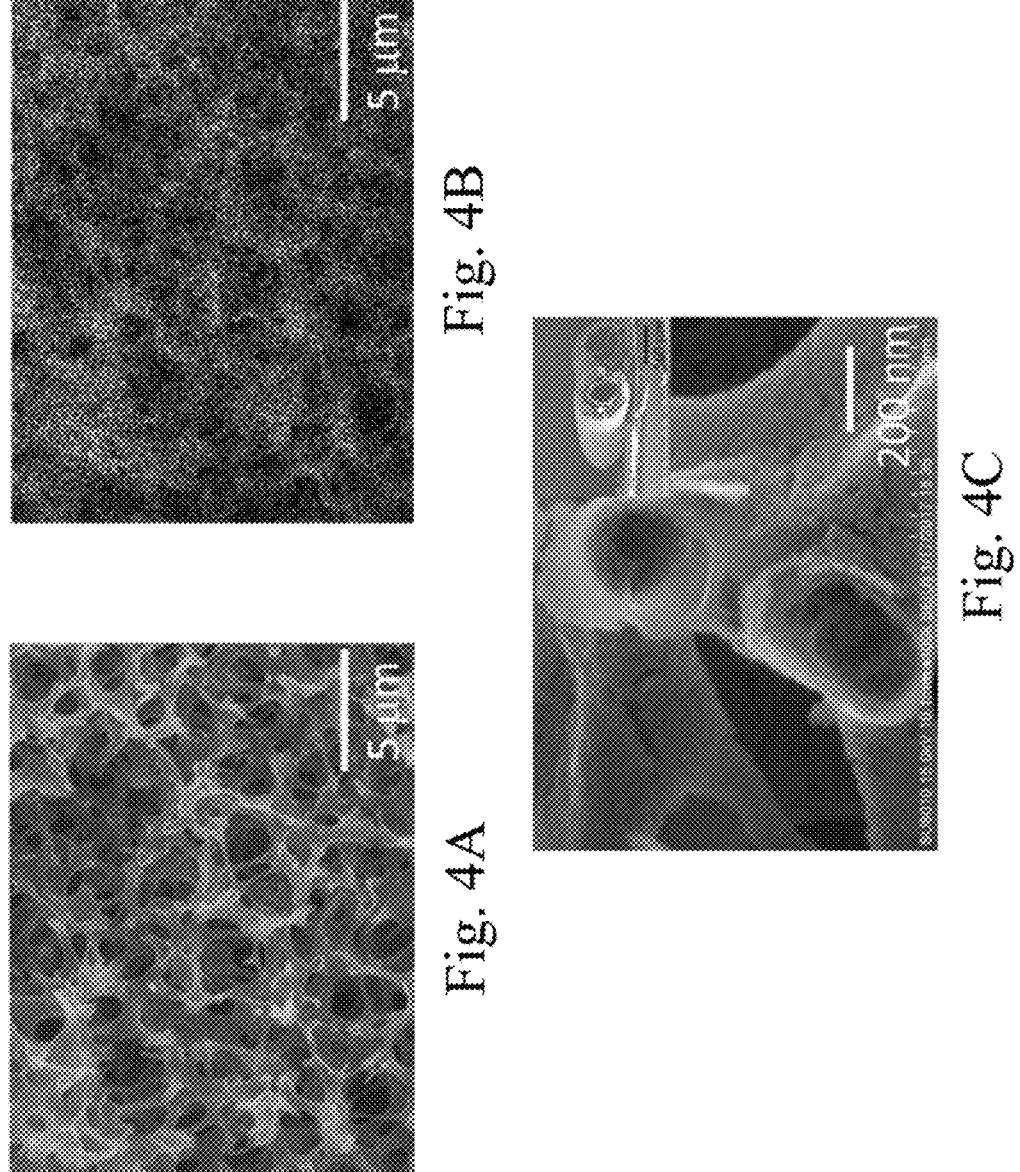
FIG. 4A is an SEM image of Example 2 of the present disclosure.
FIG. 4B is an EDX elemental mapping image of carbon element of Example 2 of the present disclosure.
FIG. 4C is another SEM image of Example 2 of the present disclosure.

Please refer to FIGS. 4A to 4C. FIG. 4A is an SEM image of Example 2 of the present disclosure. FIG. 4B is an EDX elemental mapping image of carbon element of Example 2 of the present disclosure. FIG. 4C is another SEM image of Example 2 of the present disclosure.

As shown in FIGS. 4A and 4C, the SEM images under different magnifications show that after the heating step with a higher temperature, the macroscopic structure and the interconnected nanostructure of Example 2 are intact and almost identical to the structure of the polymer template before the heating step. Further, as shown in FIG. 4B, the carbon element is distributed evenly, indicating that the polymer template has been completely carbonized into the carbon template.

Figure 5A:
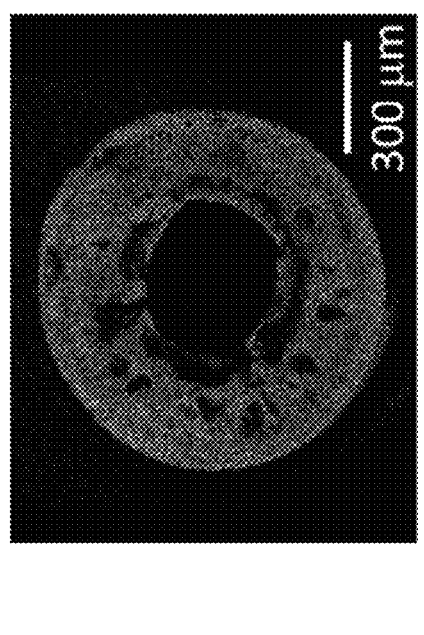
FIG. 5A is an SEM image of Example 3 of the present disclosure.
Figure 5B:
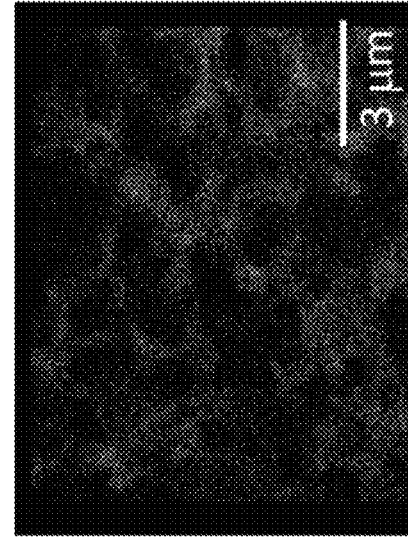
FIG. 5B is an EDX elemental mapping image of aluminum element of Example 3 of the present disclosure.
Figure 5C:
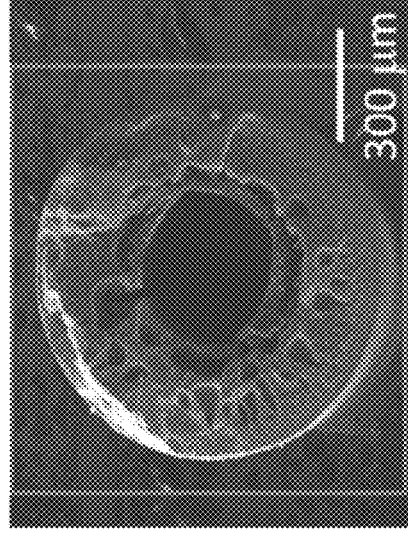
FIG. 5C is another SEM image of Example 3 of the present disclosure.
Figure 5D:
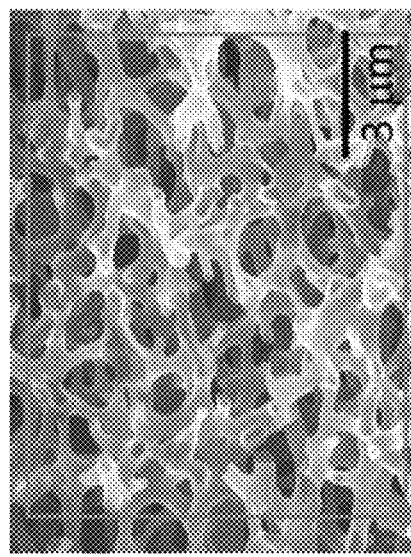
FIG. 5D is an EDX elemental mapping image of carbon element of Example 3 of the present disclosure.

Please refer to FIGS. 5A to 5D. FIG. 5A is an SEM image of Example 3 of the present disclosure. FIG. 5B is an EDX elemental mapping image of aluminum element of Example 3 of the present disclosure. FIG. 5C is another SEM image of Example 3 of the present disclosure. FIG. 5D is an EDX elemental mapping image of carbon element of Example 3 of the present disclosure.

As shown in FIGS. 5A and 5C, the SEM images under different magnifications show that after the heating step, the macroscopic structure and the interconnected nanostructure of Example 3 are quite intact and almost identical to the structure of the polymer template before the heating step. Further, as shown in FIGS. 5B and 5D, the distributions of the aluminum element and the carbon element are quite uniform, indicating that the polymer template has been completely carbonized into the carbon template and uniformly coated with aluminum oxide.

Figure 6:
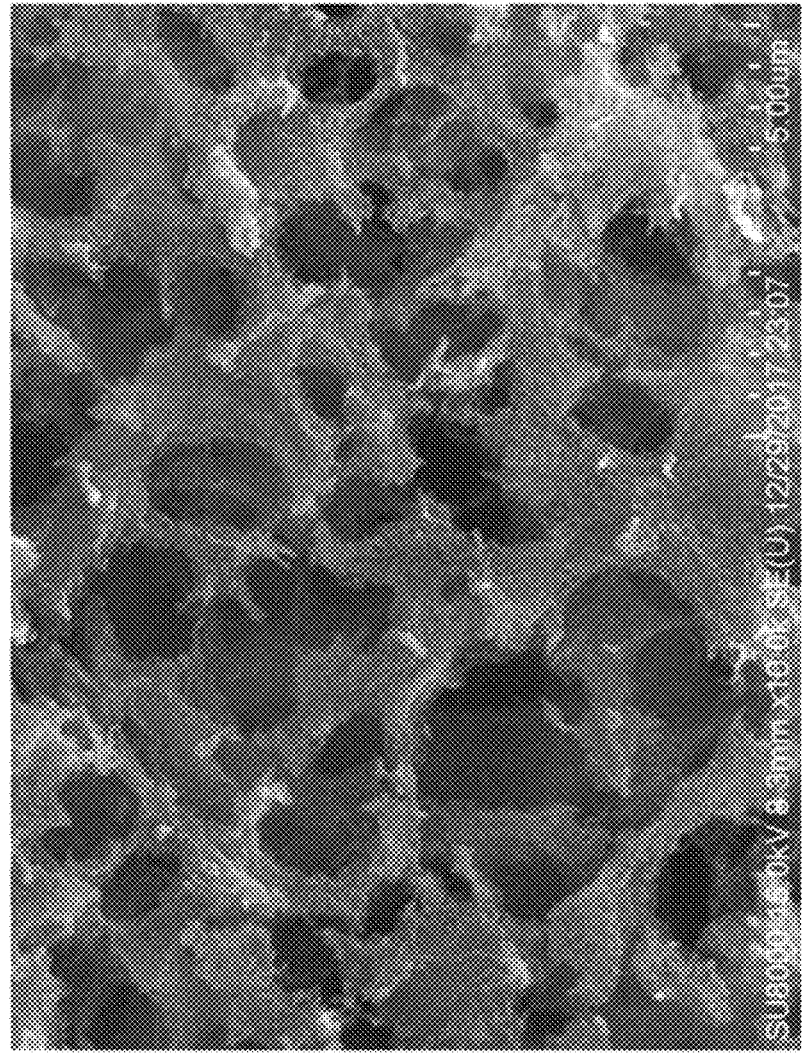
FIG. 6 is an SEM image of Example 4 of the present disclosure.

Please refer to FIG. 6, which is an SEM image of Example 4 of the present disclosure. As shown in FIG. 6, a composite with an interconnected nanostructure can be obtained by coating titanium dioxide on the polysulfone by the sol-gel method.

Figure 7:
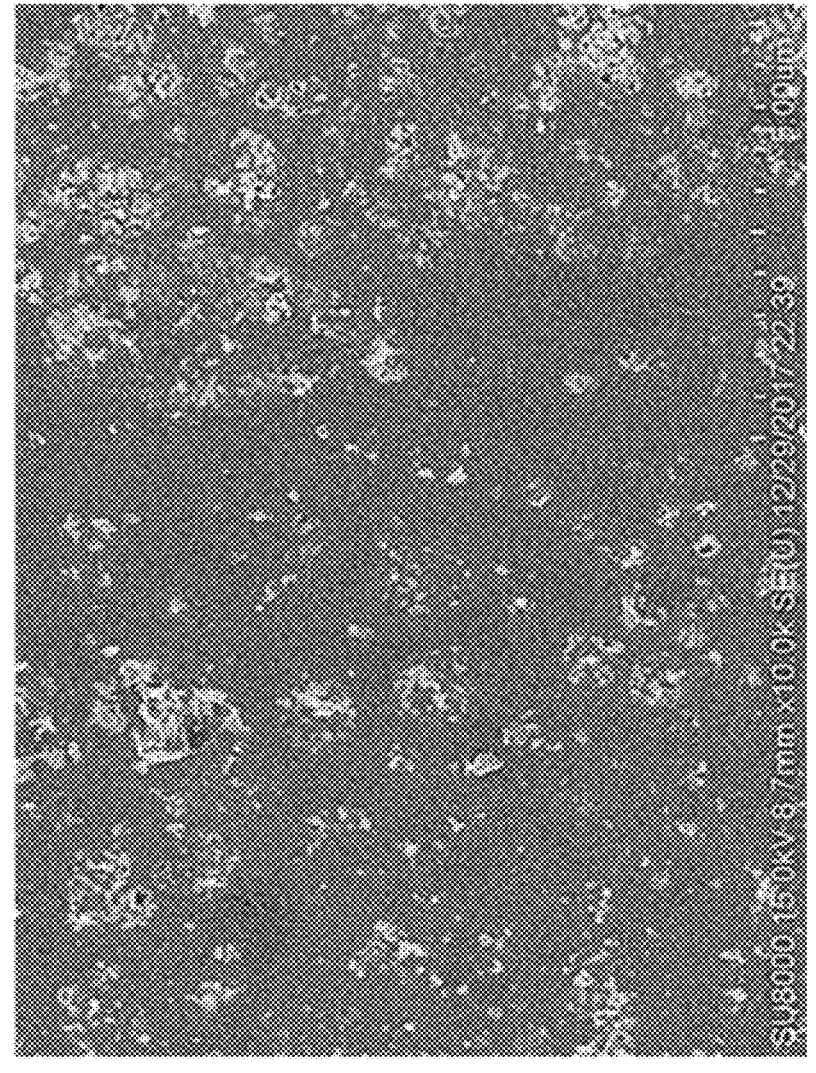
FIG. 7 is an SEM image of Comparative Example 1.

Please refer to FIG. 7, which is an SEM image of Comparative Example 1. In detail, Comparative Example 1 is a carbon material directly heated without coating the metal compound. As shown in FIG. 7, the structure and geometry of the interconnected nanostructure and mesopores of Comparative Example 1 have been completely destroyed, so that Comparative Example 1 can no longer maintain the porous structure, and its application is also limited.

According to the above analysis, compared with Comparative Example 1, Examples 1 to 4 of the present disclosure have no serious damage in either the macroscopic structure or the interconnected nanostructure, and have maintained good structural integrity which is almost identical to the original structure of the polymer template.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing statement, it is intended that the present disclosure covers modifications and variations of this disclosure provided they fall within the scope of the following claims.

What is claimed is:

1. A manufacturing method of a porous carbon composite material, comprising:
    providing a polymer template, wherein the polymer template comprises a polymer compound, the polymer template has an interconnected nanostructure, and the polymer template has a plurality of pores;
    performing a coating step, wherein a metal compound is coated on the polymer template to form a transition intermediate; and
    performing a heating step, wherein the transition intermediate is heated to transform the polymer template to a carbon template and transform the metal compound to a coating layer, and a porous carbon composite material is obtained.

2. The manufacturing method of the porous carbon composite material of claim 1, wherein the polymer compound is polyacrylonitrile, polyimide, cellulose or polysulfone.

3. The manufacturing method of the porous carbon composite material of claim 1, wherein the metal compound is a metal oxide.

4. The manufacturing method of the porous carbon composite material of claim 1, wherein in the coating step, an atomic layer deposition method or a sol-gel method is used to coat the metal compound on the polymer template.

5. The manufacturing method of the porous carbon composite material of claim 1, wherein a thickness of the metal compound coated on the polymer template is 1 Å to 2000 Å.

6. The manufacturing method of the porous carbon composite material of claim 5, wherein a thickness of the metal compound coated on the polymer template is 50 Å to 2000 Å.

7. The manufacturing method of the porous carbon composite material of claim 1, wherein in the heating step, the transition intermediate is heated at a heating temperature, and the heating temperature is 500° C. to 1000° C.

8. The manufacturing method of the porous carbon composite material of claim 1, wherein the heating step is performed under an ammonia atmosphere or an inert gas atmosphere.

9. A porous carbon composite material manufactured by the manufacturing method of the porous carbon composite material of claim 1, and the porous carbon composite material comprising:
    the carbon template having a plurality of mesopores, the carbon template has an interconnected nanostructure, wherein a diameter of each of the mesopores is 2 nm to 50 nm; and
    the coating layer coated on the carbon template.

10. The porous carbon composite material of claim 9, wherein the porous carbon composite material is a hollow fiber structure or an aerographite structure.

11. The porous carbon composite material of claim 9, wherein the coating layer is a metal oxide, a metal oxynitride or a metal nitride.

* * * * *